United States Patent
Takeshita et al.

(10) Patent No.: US 9,455,295 B2
(45) Date of Patent: Sep. 27, 2016

(54) SOLID-STATE IMAGE SENSOR WITH MOS CAPACITOR STORAGE SECTION TO WHICH A NEGATIVE BIAS IS APPLIED AFTER A RESET SAMPLING PERIOD AND ELECTRONIC DEVICE INCORPORATING SAME

(71) Applicant: Sony Corporation, Tokyo (JP)

(72) Inventors: Kaneyoshi Takeshita, Tokyo (JP); Kazuki Nomoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 35 days.

(21) Appl. No.: 13/854,689

(22) Filed: Apr. 1, 2013

(65) Prior Publication Data
US 2013/0277535 A1  Oct. 24, 2013

(30) Foreign Application Priority Data
Apr. 20, 2012 (JP) ................................ 2012-096180

(51) Int. Cl.
| | | |
|---|---|---|
| H01L 27/146 | (2006.01) | |
| H01L 27/148 | (2006.01) | |
| H04N 5/361 | (2011.01) | |
| H04N 5/374 | (2011.01) | |
| H04N 5/3745 | (2011.01) | |

(52) U.S. Cl.
CPC ... *H01L 27/14643* (2013.01); *H01L 27/14609* (2013.01); *H01L 27/14806* (2013.01); *H04N 5/361* (2013.01); *H04N 5/374* (2013.01); *H04N 5/37452* (2013.01); *H01L 27/14603* (2013.01)

(58) Field of Classification Search
USPC ....... 250/208.1, 214 R, 214.1; 257/290–292, 257/440; 348/292–311
See application file for complete search history.

(56) References Cited

U.S. PATENT DOCUMENTS

| | | | | |
|---|---|---|---|---|
| 7,115,923 | B2* | 10/2006 | Hong | 257/290 |
| 9,082,652 | B2* | 7/2015 | Ueda | H01L 27/11521 |
| 2010/0230579 | A1* | 9/2010 | Watanabe | 250/208.1 |

FOREIGN PATENT DOCUMENTS

| | | | |
|---|---|---|---|
| JP | 2008-103647 | | 5/2008 |
| JP | 2010-226375 | | 10/2010 |
| WO | WO2011/118076 | * | 9/2011 |

* cited by examiner

*Primary Examiner* — Que T Le
(74) *Attorney, Agent, or Firm* — Chip Law Group

(57) ABSTRACT

There is provided a solid-state image sensor including a plurality of unit pixels arranged thereon, the plurality of unit pixels each including a light receiving section which stores a charge generated by photoelectric conversion, a signal storage section which is connected to the light receiving section and has a structure of a MOS capacitor, and a signal output section to which a gate electrode of the MOS capacitor is connected.

22 Claims, 12 Drawing Sheets

FIG. 1
PRIOR ART
EXPOSURE TIME PERIOD
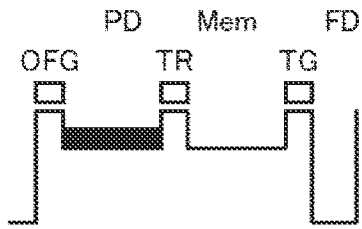
(a)
PRIOR ART        HOLDING TIME PERIOD
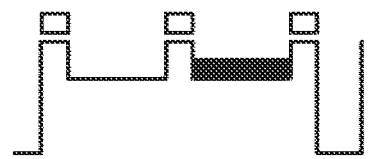
(b)
PRIOR ART        READING TIME PERIOD
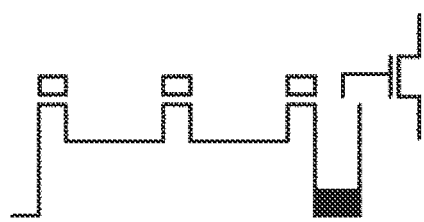
(c)

PRIOR ART  FIG. 2
EXPOSURE TIME PERIOD
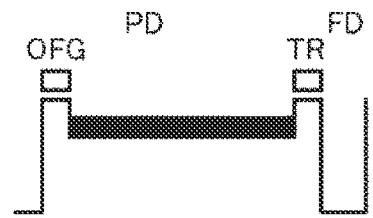
(a)
PRIOR ART  HOLDING TIME PERIOD
(b)
PRIOR ART  READING TIME PERIOD
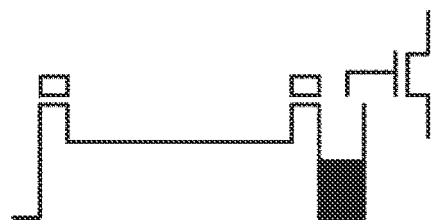
(c)

FIG. 3
EXPOSURE TIME PERIOD
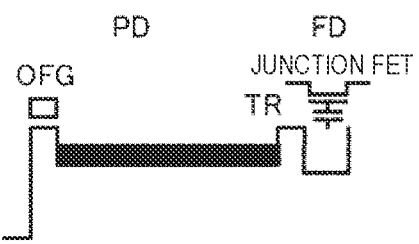
(a)
HOLDING TIME PERIOD
(b)
READING TIME PERIOD
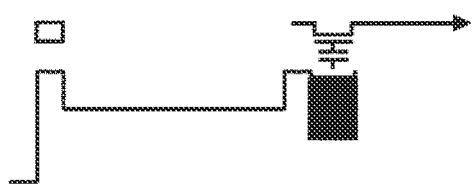
(c)

FIG. 4
EXPOSURE TIME PERIOD
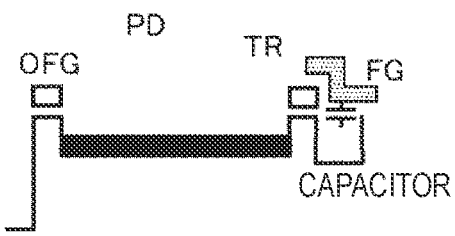
(a)
HOLDING TIME PERIOD
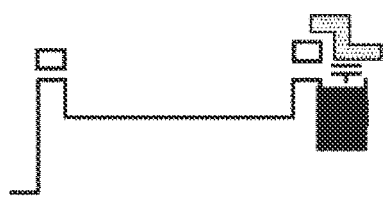
(b)
READING TIME PERIOD
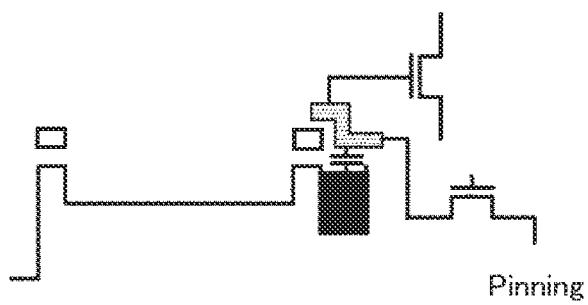
(c)

SOLID-STATE IMAGE SENSOR WITH MOS CAPACITOR STORAGE SECTION TO WHICH A NEGATIVE BIAS IS APPLIED AFTER A RESET SAMPLING PERIOD AND ELECTRONIC DEVICE INCORPORATING SAME

BACKGROUND

The present technology relates to a solid-state image sensor and an electronic device, and particularly relates to a solid-state image sensor and an electronic device making it possible to acquire a natural and beautiful image by using an image sensor.

In recent years, a CMOS image sensor has been widely used as an imaging device. However, the CMOS image sensor generally performs reading in sequence for each pixel and thus is not capable of realizing simultaneity in an entire image.

That is, the CMOS image sensor executes an operation in which a photocharge generated by a photoelectric conversion section and stored therein is sequentially scanned and read for each pixel or each line. In the case of the sequential scanning, that is, in the case of employing a rolling shutter as an electronic shutter, exposure for storing the photocharge may be difficult to be started or terminated at the same time in each pixel. Accordingly, when an image of a moving subject is captured, the sequential scanning might disadvantageously result in distortion in the captured image.

Such a type of image distortion is not allowed in image capturing of a subject moving at high speed or in sensing involving simultaneity of image capturing. For these purposes, a global shutter is employed as the electronic shutter, the global shutter executing start or termination of the exposure at the same time for all the pixels in a pixel array.

In an image sensor employing the global shutter as the electronic shutter, a charge storage section using a semiconductor memory, for example, is provided in each pixel. The image sensor employing the global shutter ensures the simultaneity in the entire image in such a manner that charges are transferred at the same time from photodiodes to semiconductor memories, stored in the semiconductor memories, and then read in sequence (for example, see JP 2008-103647A).

In other words, in the case of employing the global shutter in the CMOS image sensor, it is necessary to provide a region where a signal corresponding to a charge obtained by light receiving is stored in a time period from turning off of the shutter to the start of reading the signal. For this reason, reduction of a light receiving area and a storage area involved with the advance of pixel microminiaturization is likely to cause deterioration of sensitivity or a dynamic range.

Hence, there is proposed avoidance or the like of the reduction of the light receiving area or the storage area by using a floating diffusion (FD) as a storage region.

Further, there is also proposed an image sensor including: a floating diffusion FD; and a transistor MT which includes a floating gate (FG) serving as a charge storage section and a gate electrode CG connected to the floating diffusion FD (for example, see JP 2010-226375A). Thereby, the global shutter and the rolling shutter are made mutually compatible and thus the number of transistors provided in a pixel section can be three at the minimum, and microminiaturization of the pixel section, for example, is facilitated.

SUMMARY

However, the use of the FD as the storage region prevents pinning and thus causes image quality deterioration due to a dark current or a defect attributable to a crystal defect caused by a high-density impurity. Further, a long time from FD resetting to signal reading makes difficult noise elimination using CDS (Correlated Double Sampling).

In addition, there is a proposal for realizing reading through a floating gate (FG) using a CMD (Charge Modulation Device) technique, for example. However, in the proposal, a device structure is complicated, and a crystal defect attributable to source/drain proximity to a storage section of a photo diode and a dark current are likely to be increased.

The present technology is disclosed under such circumstances, and it is desirable to make it possible to enhance the sensitivity of an image sensor employing a global shutter and to appropriately reduce noise.

According to an embodiment of the present disclosure, there is provided a solid-state image sensor including a plurality of unit pixels arranged thereon, the plurality of unit pixels each including a light receiving section which stores a charge generated by photoelectric conversion, a signal storage section which is connected to the light receiving section and has a structure of a MOS capacitor, and a signal output section to which a gate electrode of the MOS capacitor is connected.

The signal output section may include a transistor and output, to a vertical signal line of a pixel array in which the plurality of unit pixels arranged, a signal based on a change in a potential of the gate electrode occurring in accordance with a charge stored in the signal storage section.

The light receiving section and the signal storage section may be connected via a transfer transistor. The charge stored in the light receiving section may be transferred via the transfer transistor, and thereafter, the charge stored in the signal storage section may be depleted.

The charge stored in the signal storage section may be depleted by discharging the charge stored in the signal storage section via the light receiving section with a potential of the transfer transistor high and a potential of the gate electrode of the MOS capacitor low.

The solid-state image sensor may further include a depletion transistor connected to the gate electrode of the MOS capacitor. The charge stored in the signal storage section may be depleted by discharging the charge stored in the signal storage section with a potential of the depletion transistor high and the potential of the gate electrode of the MOS capacitor low.

In a case of performing CDS processing of detecting a difference between a signal component and a reset component of a signal output from each of the plurality of unit pixels, the charge stored in the signal storage section may be depleted after an end of a D-phase sampling period and before a start of a P-phase sampling period in the CDS processing.

The solid-state image sensor may further include a potential control section which applies a negative bias to the gate electrode of the MOS capacitor.

The potential control section may apply the negative bias to the gate electrode of the MOS capacitor after an end of the P-phase sampling period.

An electronic shutter operation of discharging the charge stored in the light receiving section may be concurrently performed in each of the plurality of unit pixels. The charge stored in the light receiving section may be transferred to the signal storage section in response to an identical exposure time period in each of the plurality of unit pixels. The charge stored in the signal storage section may be held in a period until a reading time which varies depending on an arrangement position of each of the plurality of unit pixels in the pixel array.

The MOS capacitor may be provided as a buried-channel MOS, a potential may be set low on a surface of a channel, and a region having a deep potential may be formed away from the surface to store a signal charge.

The MOS capacitor may include a junction FET.

According to a second embodiment of the present disclosure, there is provided an electronic device including a solid-state image sensor having a plurality of unit pixels arranged thereon, the plurality of unit pixels each including a light receiving section which stores a charge generated by photoelectric conversion, a signal storage section which is connected to the light receiving section and has a structure of a MOS capacitor, and a signal output section to which a gate electrode of the MOS capacitor is connected.

In the first and second aspects of the present technology, the light receiving section which stores the charge generated by the photoelectrical conversion is connected to the signal storage section in the MOS capacitor structure, and the plurality of unit pixels are arranged on the solid-state image sensor, the unit pixels each including the gate electrode of the MOS capacitor connected to the signal output section.

According to the embodiments of the present disclosure described above, the sensitivity of an image sensor employing a global shutter can be enhanced, and noise can be appropriately reduced.

BRIEF DESCRIPTION OF THE DRAWINGS

FIG. 1 is a conceptual diagram of an operation of a CMOS image sensor including a FD and a Mem (a semiconductor memory);

FIG. 2 is a conceptual diagram of an operation of a CMOS image sensor using a FD as a storage region;

FIG. 3 is a conceptual diagram of an operation of a CMD image sensor;

FIG. 4 is a conceptual diagram of an operation of a CMOS image sensor according to an embodiment of the present technology;

DETAILED DESCRIPTION OF THE EMBODIMENT

Figure 5:
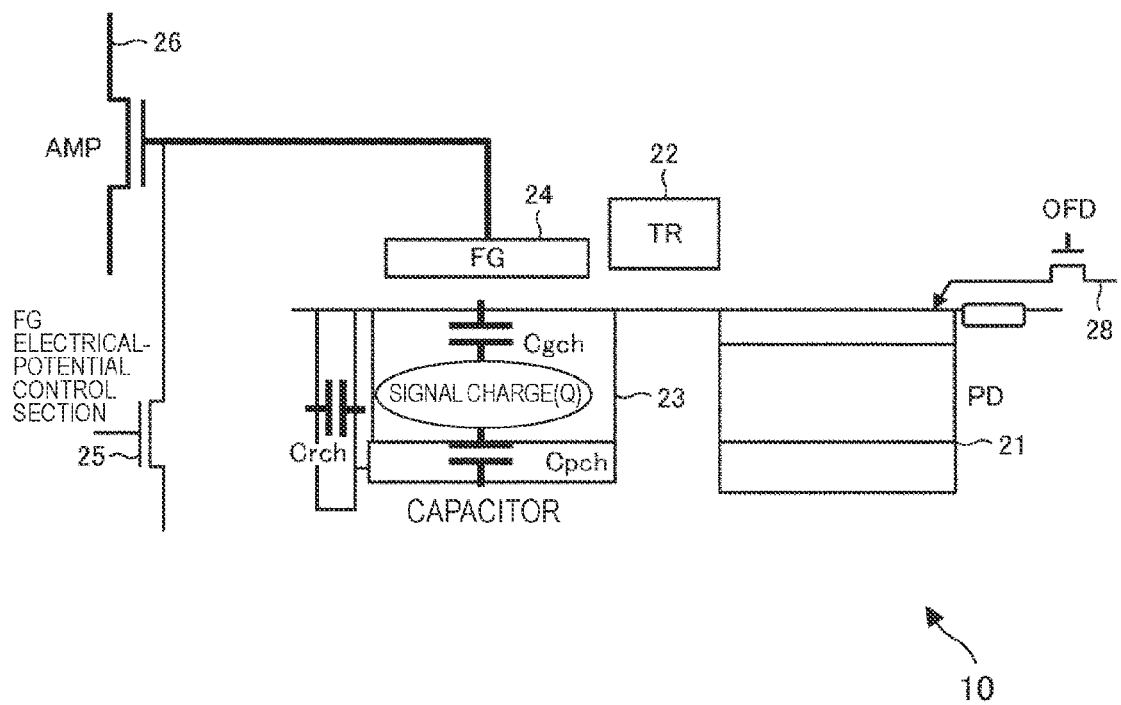
FIG. 5 is a diagram showing a configuration example of one of unit pixels of a CMOS image sensor according to an embodiment of the present technology.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Firstly, a description is given of a global shutter mechanism.

A CMOS image sensor executes an operation in which a photocharge generated and stored in a photoelectric conversion section is sequentially scanned and read for each pixel or each line. In the sequential scanning, i.e., in the case of employing a rolling shutter as an electronic shutter, exposure for storing a photocharge may be difficult to be started or terminated at the same time in each pixel. Accordingly, when an image of a moving subject is captured, the sequential scanning might disadvantageously result in distortion in the captured image.

Such a type of image distortion is not allowed in image capturing of a subject moving at high speed or in sensing involving simultaneity of image capturing. For these purposes, a global shutter is employed as the electronic shutter, the global shutter executing start or termination of the exposure at the same timing for all the pixels in a pixel array.

In an image sensor employing the global shutter as the electronic shutter, a charge storage section using a semiconductor memory, for example, is provided in each pixel. The image sensor employing the global shutter ensures the simultaneity in the entire image in such a manner that charges are transferred at the same time from photodiodes to semiconductor memories, stored in the semiconductor memories, and then read in sequence.

In other words, in the case of employing the global shutter in the CMOS image sensor, it is necessary to provide a region where a signal corresponding to a charge obtained by light receiving is stored (held) in a time period from turning off of the shutter (the end of an exposure time period) to the start of reading the signal.

FIG. 1 is a conceptual diagram of an operation of a CMOS image sensor including a FD and a Mem.

As shown in FIG. 1(a), a charge is stored in a photodiode (a PD) in the exposure time period. Hatched regions in FIG. 1 each represent the charge stored therein. Note that the charge in the PD is discharged from an overflow gate (OFG) of a transistor connected to the PD when the electronic shutter operates.

As shown in FIG. 1(b), the charge is held in the Mem in a holding time period. Note that the charge stored in the PD is transferred to the Mem through a transfer transistor (TR) at the end of the exposure time period.

As shown in FIG. 1(c), a voltage corresponding to the charge stored in the FD is read as a signal in the reading time period. Note that the charge stored in the Mem is transferred to the FD through a transfer transistor (TG) at the end of the holding time period.

In the case of the CMOS image sensor including the FD and the Mem, an image is captured by the global shutter system in this way. However, in the case of the CMOS image sensor including the FD and the Mem, it is necessary to secure a region for arranging the Mem on a substrate. For this reason, the reduction of the light receiving area and the storage area involved with the advance of pixel microminiaturization is disadvantageously likely to cause the deterioration of the sensitivity or the dynamic range.

Hence, there is proposed avoidance or the like of the reduction of the light receiving area or the storage area by using the FD as a storage region without providing the Mem. FIG. 2 is a conceptual diagram of an operation of a CMOS image sensor using the FD as the storage region.

As shown in FIG. 2(a), a charge is stored in a PD in the exposure time period. Hatched regions in FIG. 2 each represent the charge stored therein. Note that the charge in the PD is discharged from an OFG of a transistor connected to the PD when the electronic shutter operates.

As shown in FIG. 2(b), the charge is held in a FD in the holding time period. Note that the charge stored in the PD is transferred to the FD through a transfer transistor (TR) at the end of the exposure time period.

As shown in FIG. 2(c), a voltage corresponding to the charge stored in the FD is read as a signal in the reading time period.

In the case of the CMOS image sensor using the FD as the storage region, an image is captured by the global shutter system in this way. However, in the case of the CMOS image sensor using the FD as the storage region, a junction leakage influences the FD. In addition, a long time interval from FD resetting to signal reading makes CDS difficult, and thus kTC noise (reset noise) becomes a bottleneck.

A CMD method is also studied as an idea for realizing a signal holding region without area loss. FIG. 3 is a conceptual diagram of an operation of a CMD image sensor.

As shown in FIG. 3(a), a charge is stored in a PD in the exposure time period. Hatched regions in FIG. 3 each represent the charge stored therein. Note that the charge in the PD is discharged from an OFG of a transistor connected to the PD when the electronic shutter operates.

As shown in FIG. 3(b), the charge is held in a FD in the holding time. Note that the charge stored in the PD is transferred to the FD through a transfer transistor (TR) at the end of the exposure time period.

As shown in FIG. 3(c), a voltage corresponding to the charge stored in the FD is read as a signal in the reading time period. At this time, the signal corresponding to the charge held in the FD is read through a junction FET. In other words, threshold voltage change according to a voltage supplied to a gate electrode is read as a signal.

In the case of the CMD image sensor, an image is captured by the global shutter system in this way. However, the CMD image sensor has a structure of stacking the FD, a stray capacitance which converts a signal charge into a voltage, and an amplifier transistor, and thus is difficult to share pixels. In addition, a characteristic of a dark current involved with a channel current is disadvantageously deteriorated.

FIG. 4 is a conceptual diagram of an operation of a CMOS image sensor according to an embodiment of the present technology. The present technology uses an FG and a capacitor instead of the FD.

As shown in FIG. 4(a), a charge is stored in a PD in the exposure time period. Hatched regions in FIG. 4 each represent the charge stored therein. Note that the charge in the PD is discharged from an OFG of a transistor connected to the PD when the electronic shutter operates.

As shown in FIG. 4(b), the charge is held in a capacitor in the holding time period. Note that the charge stored in the PD is transferred to the capacitor through a transfer transistor (TR) at the end of the exposure time period.

As shown in FIG. 4(c), a voltage corresponding to the charge held in the capacitor is read as a signal in the reading time period. At this time, capacity coupling occurs on a gate electrode (the FG) of the capacitor, and an electrical potential change occurring on the gate electrode is detected.

FIG. 5 is a diagram showing a configuration example of one of unit pixels of a CMOS image sensor according to an embodiment of the present technology. Note that the CMOS image sensor to which the present technology is applied is provided with a pixel array including a plurality of unit pixels 10 arranged in a two-dimensional matrix, one of the unit pixels 10 being shown in FIG. 5, for example.

As shown in FIG. 5, the unit pixel 10 is provided with a PD 21. The PD 21 includes a storage section which stores a charge corresponding to received light.

In addition, the unit pixel 10 is provided with an overflow transistor 28 connected to the PD 21. The charge stored in the storage section of the PD 21 is discharged from a drain terminal (an OFD) of the overflow transistor 28 when the electronic shutter operates. Alternatively, a configuration may be employed in which the charge is discharged from an OFG (a gate terminal) instead of the OFD.

Further, the unit pixel 10 is provided with a transfer transistor (TR) 22 connected to the PD 21. The TR 22 transfers the charge stored in the storage section of the PD 21 to a capacitor 23 to be described later at the end of the exposure time period. The TR 22 also discharges the charge held in the capacitor 23 from the OFD through the PD 21 in the course of the reading time period.

The unit pixel 10 is provided with the capacitor 23 connected to the TR 22 and is also provided with a FG 24 near a capacitance Cgch of the capacitor 23. In this example, the capacitor 23 includes three capacitances (Cgch, Cpch, and Crch), and the capacitance Cgch shown on the upper side of FIG. 5 is located near the FG 24 in the configuration.

The capacitor 23 is a MOS capacitor having, for example, a high-density P-type impurity region on the front surface side of the capacitor 23 and an N-type impurity region formed from a front surface into a deep part thereof. Accordingly, the FG 24 is formed as a gate electrode of the MOS capacitor.

Alternatively, the capacitor 23 may be formed as, for example, a buried-channel MOS in such a manner that a potential on a surface of a channel is set low, a region having a deep potential is formed away from the surface, and a signal charge is stored in the capacitor 23.

Still alternatively, the capacitor 23 can be formed by a junction FET including a gate which is formed by a P-type impurity on a front surface of the capacitor 23 and a channel portion which is formed by an N-type impurity and is located deeper than the gate portion.

The capacitor 23 is designed to hold the charge transferred by the TR 22, as a signal charge Q. For example, in the global shutter mechanism, a signal corresponding to the charge obtained by light receiving can thereby be held in a period from the end of the exposure time period to the start of reading the signal.

In addition, the capacitor 23 is designed to be depleted (initialized) by discharging the signal charge Q through the TR 22. In this case, for example, electrical potentials of the PD 21 and the TR 22 are set high, and an electrical potential of the FG 24 is set low, so that the signal charge Q is discharged from the OFD through the TR 22 and the PD 21. By depleting the capacitor 23, a signal corresponding to a reset level for the unit pixel 10 can be detected, and consequently a low noise signal subjected to the CDS processing can be detected.

Note that the capacitor 23 may be depleted in such a manner that: a depletion transistor for depleting the capacitor 23 is arranged; a source terminal of the depletion transistor is connected to the FG 24; and an electrical potential of a gate terminal is set high. In this case, it is not necessary to discharge the signal charge Q from the OFD.

The FG 24 is capacity-coupled to the capacitor 23, and is connected to a gate terminal of an amplifier transistor (AMP) 26 to be described later. When the signal charge Q is stored in the capacitor 23, an electrical potential of the FG 24 is changed in accordance with the signal charge Q. A voltage corresponding to the electrical potential change is output through the AMP 26, and thereby a signal is output from the unit pixel 10.

A signal voltage Vsig based on the electrical potential of the FG 24 can be expressed by using Formula (1).

$$V\text{sig}=Q/C\text{gch} \quad (1)$$

Accordingly, by making fully small the capacitance Cgch of the capacitor 23, the conversion efficiency can be enhanced.

Further, the unit pixel 10 is provided with the aforementioned AMP 26. The AMP 26 is designed to output a signal voltage corresponding to the electrical potential change of the FG 24 to a vertical signal line which is not shown in FIG. 5.

The unit pixel 10 is also provided with a FG electrical-potential control section 25. In this example, the FG electrical-potential control section 25 is formed as a transistor, and a drain terminal thereof is connected to the FG 24. The FG electrical-potential control section 25 is designed to apply a negative bias to the FG 24 as necessary. This makes it possible to perform pinning and thus to reduce occurrences of a dark current caused by an interface trap, for example.

Figure 6:
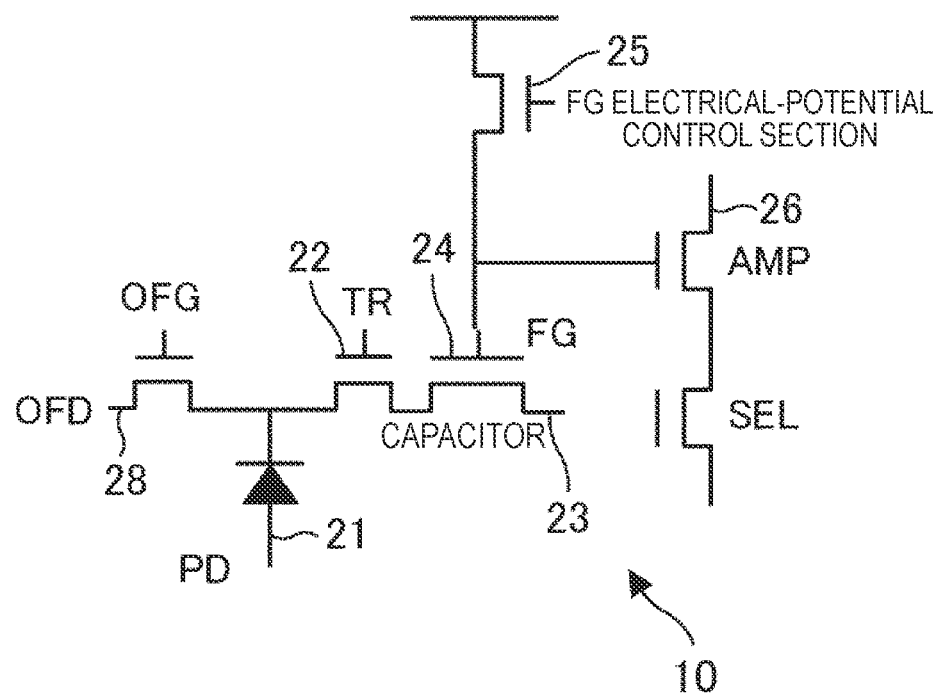
FIG. 6 is an equivalent circuit diagram of the unit pixel described above with reference to FIG. 5.

FIG. 6 is an equivalent circuit of the unit pixel 10 described above with reference to FIG. 5.

Figure 7:
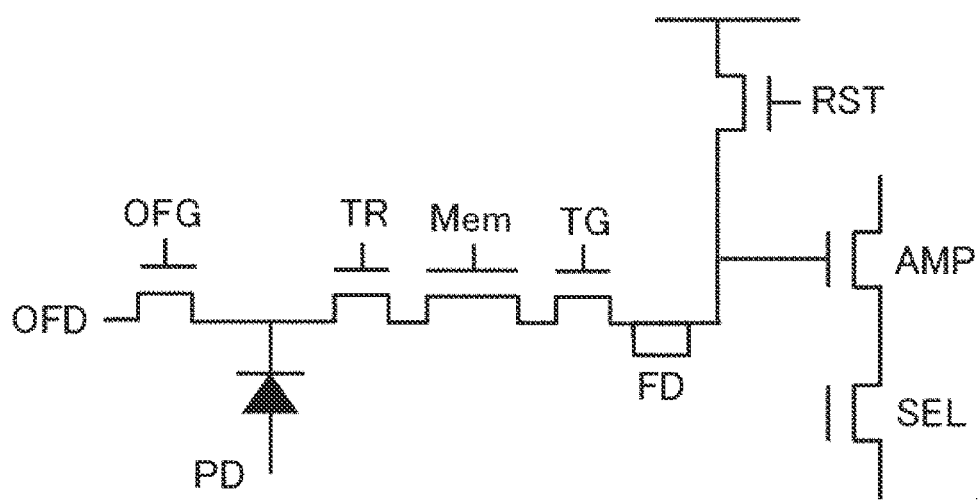
FIG. 7 is an equivalent circuit diagram of a unit pixel of a CMOS image sensor including a FD and a Mem.

FIG. 7 is an equivalent circuit diagram of a unit pixel (a unit pixel used in the past) of a CMOS image sensor including a FD and a Mem.

As seen from FIGS. 6 and 7, it is not necessary to provide the Mem in the unit pixel 10 to which the present technology is applied. In addition, a transistor used as a reset transistor in the unit pixel used in the past is used as the FG electrical-potential control section 25 in the unit pixel 10 to which the present technology is applied.

Figure 8:
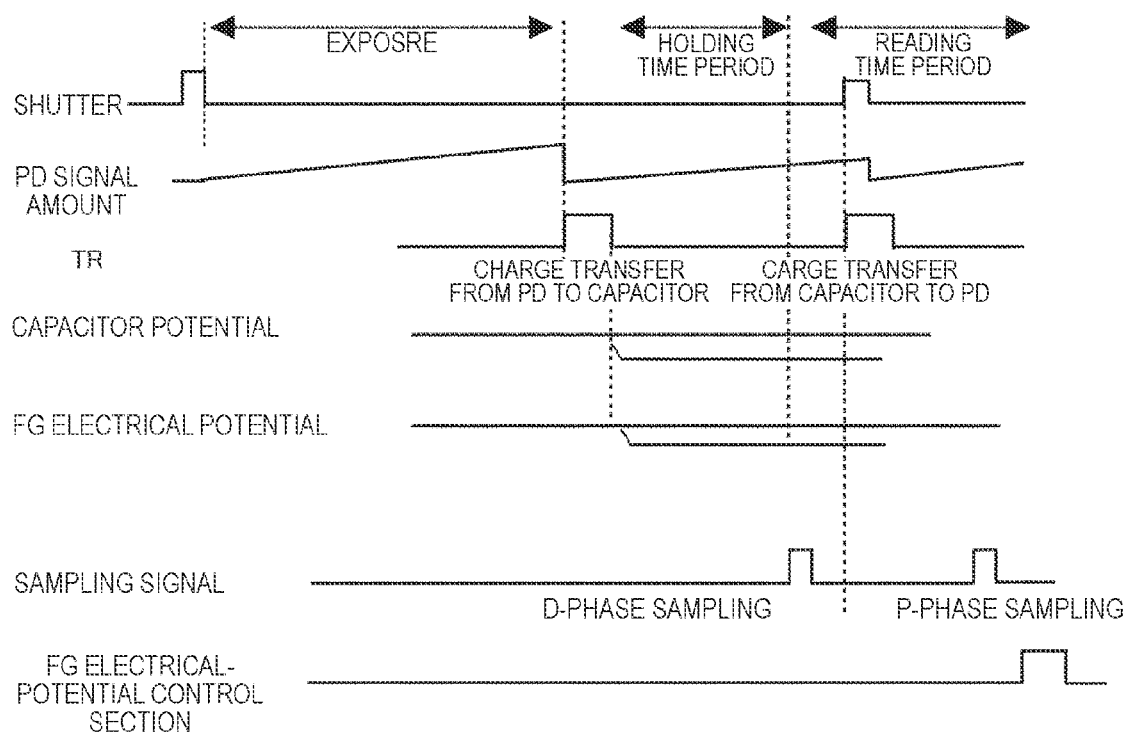
FIG. 8 is a timing chart illustrating an exposure time period, a holding time period, and a reading time period in the unit pixel shown in FIG. 5 or 6.

FIG. 8 is a timing chart illustrating the exposure time period, the holding time period, and the reading time period in the unit pixel 10 shown in FIG. 5 or 6. A horizontal axis in FIG. 8 represents time, while a vertical axis appropriately represents a signal, an electrical potential, a potential or the like shown in FIG. 8.

In the uppermost row, FIG. 8 shows a shutter signal for performing an electronic shutter operation on the unit pixel 10. At timing of a pulse of the shutter signal, the overflow transistor 28 is driven, and the charge stored in the storage section of the PD 21 is discharged from the OFD or the OFG. Upon initial input of the shutter pulse, the exposure time period is started in the unit pixel 10.

In the second row from the top, FIG. 8 shows a signal amount corresponding to a charge stored in the storage section of the PD 21. In the third row from the top, FIG. 8 shows a driving signal for the TR 22.

As shown in FIG. 8, the signal amount of the PD 21 is reset to an initial value immediately after a pulse of the shutter signal is input. Thereafter, the signal amount is gradually increased due to light received by the PD 21.

In addition, since the charge is transferred from the PD 21 to the capacitor 23 upon input of a pulse of the driving signal for the TR 22, the signal amount of the PD 21 is set to an initial value. Thereby, the holding time period in the unit pixel 10 is started.

When a pulse of the driving signal for the TR 22 is input again and when a pulse of the shutter signal is input, the charge is transferred from the capacitor 23 to the PD 21 to deplete the capacitor 23. Thus, the signal amount of the PD 21 is set to the initial value.

In the fourth row from the top, FIG. 8 shows a potential of the capacitor 23. In the fifth row from the top, FIG. 8 shows an electrical potential of the FG 24.

As shown in FIG. 8, since the charge is transferred from the PD 21 to the capacitor 23 upon input of the pulse of the driving signal for the TR 22, the potential of the capacitor 23 becomes low. Accompanying this, the electrical potential of the FG 24 also becomes low.

In the sixth row from the top, FIG. 8 shows a sampling signal. The sampling signal is a CDS-related signal.

The signal output from the unit pixel 10 is supplied to, for example, an up/down counter. By causing the up/down counter to perform firstly a count-up operation and secondly a count-down operation, subtraction is automatically performed in the up/down counter. Since a reset component having variation in unit pixels is eliminated by the two-time reading operations and the subtraction in the up/down counter, the CDS can be performed by which only a signal component corresponding to an incident light amount of each unit pixel is extracted.

A period of the count-down performed by the up/down counter is referred to as a P-phase (Reset Phase) sampling period, while a period of the count-down is referred to as a D-phase (Data Phase) sampling period. In the present technology, the D-phase sampling period is started at almost the same timing as the start of the reading time period.

In the example in FIG. 8, in the reading time period, a D-phase sampling pulse is input before the capacitor 23 is depleted, and a period corresponding to the width of the pulse is set as the D-phase sampling period. Thereby, a signal voltage (that is, the signal component) corresponding to the signal charge Q held in the capacitor 23 is sampled.

In addition, in the reading time period, a P-phase sampling pulse is input after the capacitor 23 is depleted, and a period corresponding to the width of the pulse is set as the P-phase sampling period. Thereby, a signal voltage corresponding to the charge (that is, the reset component) at the time of depleting the capacitor 23 is sampled.

This makes it possible to perform the CDS processing on the signal output from the unit pixel 10.

In the seventh (lowermost) row, FIG. 8 shows a driving signal for the FG electrical-potential control section 25. In the example in FIG. 8, in the reading time period, a drive pulse for the FG electrical-potential control section 25 is input after the P-phase sampling period expires. Upon input of the drive pulse for the FG electrical-potential control section 25, a negative bias is applied to the FG 24, and pinning is performed.

Figure 9:
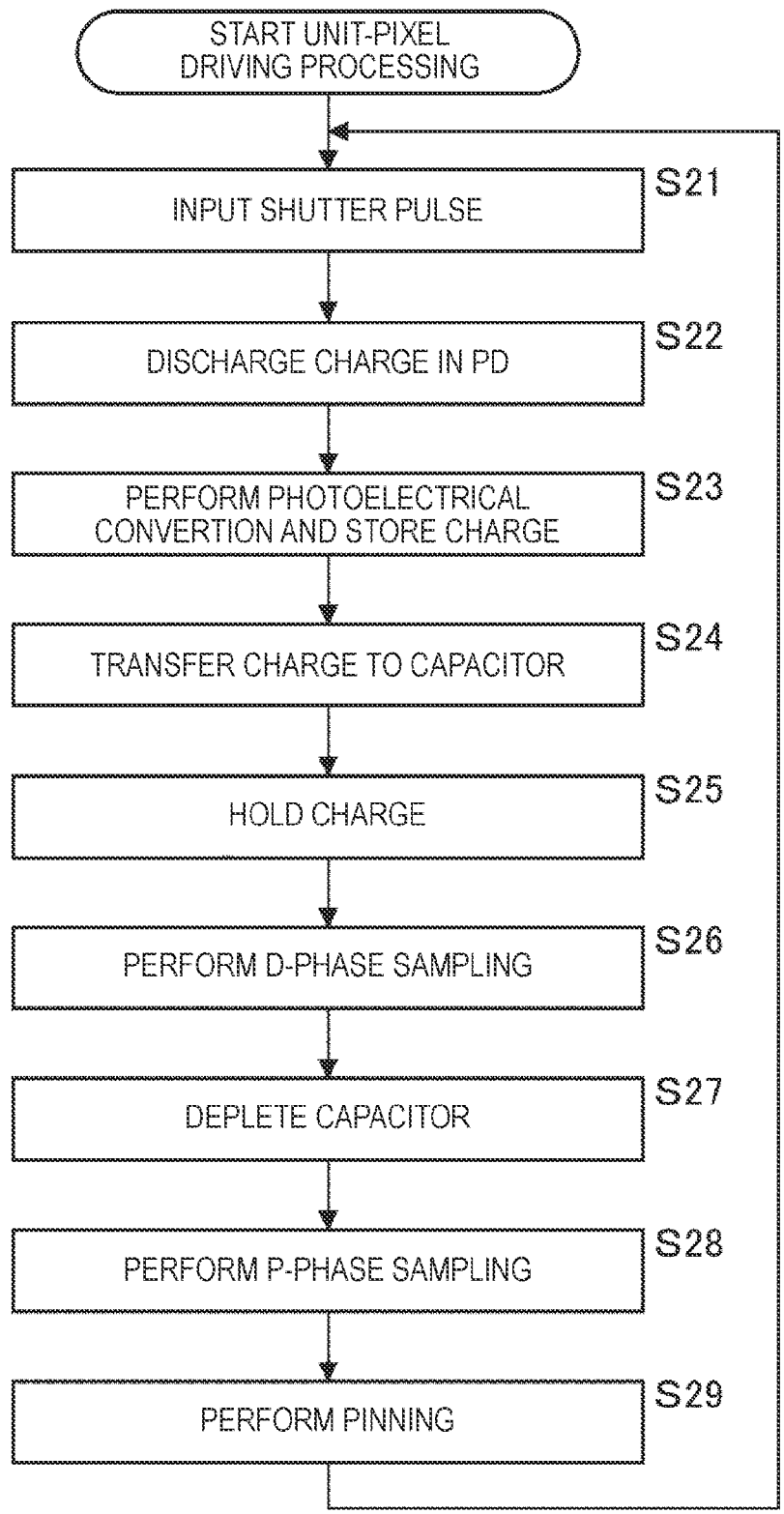
FIG. 9 is a flowchart illustrating unit-pixel driving processing.

FIG. 9 is a flowchart illustrating processing of driving the unit pixel 10 shown in FIG. 8.

In Step S21, the shutter pulse is input.

In Step S22, the charge in the PD 21 is discharged. In other words, since the shutter pulse is input in Step S21, the overflow transistor 28 is driven, and the charge stored in the storage section of the PD 21 is discharged from the OFD or the OFG.

In Step S23, light received by the PD 21 is photoelectrically converted to store a charge in the storage section of the PD 21.

In Step S24, the charge stored in the processing in Step S23 is transferred to the capacitor 23. Thereby, the potential of the capacitor 23 becomes low. Accompanying this, the electrical potential of the FG 24 also becomes low.

In response to the processing in Step S24, the charge held in the capacitor 23 is held until a predetermined time point in the reading time period (Step S25).

In Step S26, the D-phase sampling is performed.

After the D-phase sampling is completed, the capacitor 23 is depleted in Step S27. At this time, for example, the electrical potentials of the PD 21 and the TR 22 are set high, and the electrical potential of the FG 24 is set low, so that the signal charge Q held in the capacitor 23 is discharged from the OFD through the TR 22 and the PD 21.

After the processing in Step S27, the P-phase sampling is performed in Step S28.

Note that the CDS processing in which the result of the P-phase sampling in Step S28 is subtracted from the result of the D-phase sampling in Step S26 is performed inside a not shown column processing circuit, for example.

After the processing in Step S28, pinning is performed on the FG 24 in Step S29. At this time, a drive pulse for, for example, the FG electrical-potential control section 25 is input, and a negative bias is applied to the FG 24.

Then, the processing moves back to Step S21, and execution of the subsequent processing is repeated.

In this way, unit-pixel driving processing is executed.

When the global shutter is employed, this configuration enables the capacitor 23 to hold a signal corresponding to the charge obtained by light receiving in the period from the turning off of the shutter (the exposure time period expires) to the start of the reading the signal. This makes it possible to avoid the reduction of the light receiving area or the storage area, as in, for example, the CMOS image sensor used in the past using the FD as the storage region.

Moreover, even when the global shutter is employed, this configuration makes it possible to execute the CDS processing in which the reset component is eliminated from the signal component. This makes it possible to acquire an accurate pixel signal and thus to capture a beautiful image.

Figure 10:
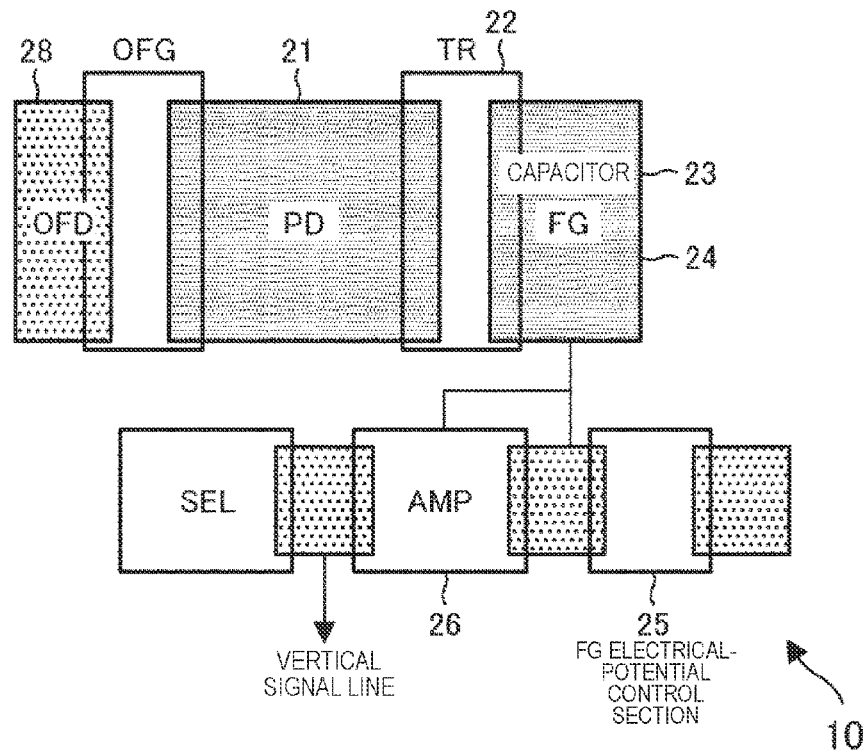
FIG. 10 is a diagram showing an example of laying out, on a substrate, the unit pixel to which the present technology is applied.

FIG. 10 is a diagram showing an example of laying out, on a substrate, the unit pixel 10 to which the present technology is applied. FIG. 10 shows a planar layout of the sections included in the unit pixel 10 which are described above with reference to FIG. 5. Note that a reference letter SEL in FIG. 10 denotes a select transistor which outputs a selection signal for outputting the signal read from the unit pixel 10 to the vertical signal line.

Figure 11:
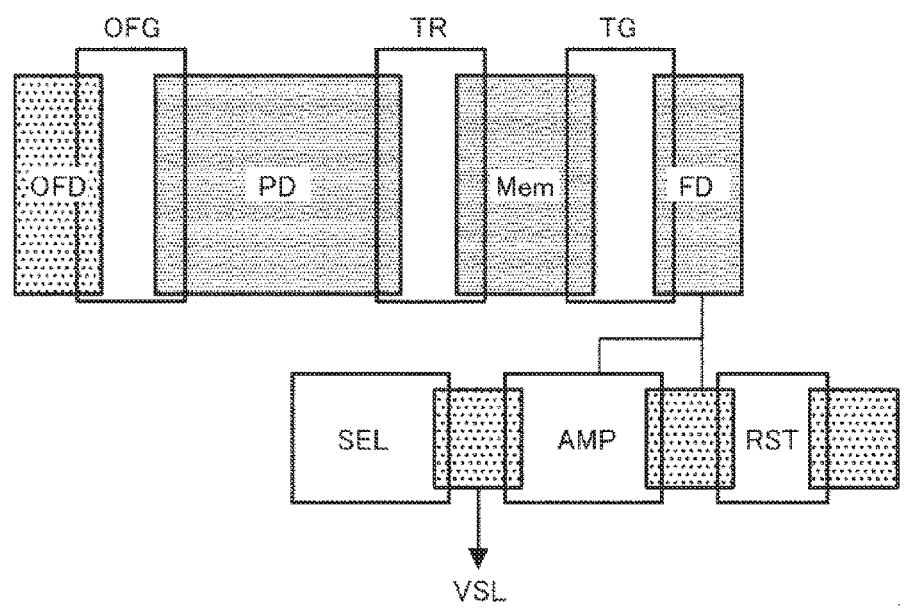
FIG. 11 is a diagram showing an example of laying out a unit pixel used in the past on a substrate.

FIG. 11 is a diagram showing an example of laying out, on a substrate, a unit pixel used in the past of a CMOS image sensor including a FD and a Mem.

As compared to the case in FIG. 10, a Mem is provided in the layout in FIG. 11 instead of the capacitor 23 and the FG 24. In addition, a TG and an FD are provided in the layout in FIG. 11. In other words, as compared to the unit pixel shown in FIG. 11 which is used in the past, the unit pixel 10 shown in FIG. 10 to which the present technology is applied eliminates the need for providing portions corresponding to the TG and the FD and can reduce the area of the substrate by the area for the portions. In this case, it is assumed that the area necessary for the Mem is approximately equivalent to the area necessary for the capacitor 23 and the FG 24.

According to the embodiment of the present technology as described above, a unit pixel can be formed on a substrate in a smaller area than that in the past. According to the embodiment of the present technology, it is possible to prevent sensitivity or dynamic range deterioration which is likely to occur due to the reduction of the light receiving area and the storage area involved with the advance of pixel microminiaturization.

In addition, according to the embodiment of the present technology, the CDS processing is performed as described above, and thus the pixel signal from which the reset component is eliminated and in which noise is appropriately reduced can be acquired from each unit pixel. For example, the past technology also provides a CMOS image sensor using a FD as a storage region. In this case, the area of the unit pixel can be made small. However, since a time interval from resetting the FD to reading a signal is long, the CDS is difficult.

That is, according to the embodiment of the present technology, the sensitivity of an image sensor employing a global shutter can be enhanced, and noise can be appropriately reduced.

Figure 12:
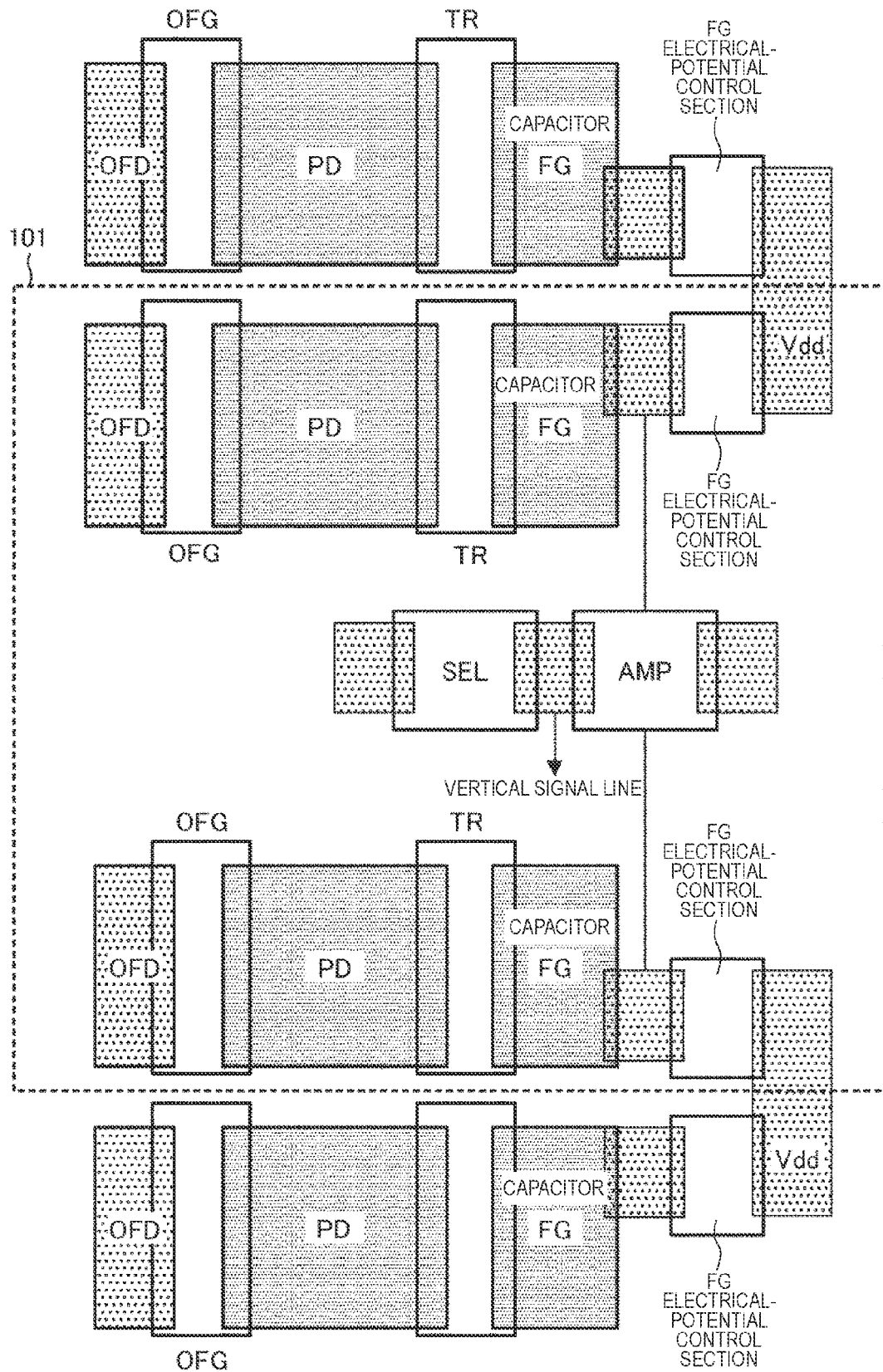
FIG. 12 is a diagram showing an example of substrate layout in a case of employing a pixel sharing configuration using the unit pixels to which the present technology is applied.

FIG. 12 is a diagram showing an example of substrate layout in a case of employing a pixel sharing configuration in a pixel array of a CMOS image sensor by using the unit pixels to which the present technology is applied. This example shows a configuration in which two unit pixels in a portion surrounded by a dotted line 101 in FIG. 12 share a SEL and an AMP. In addition, unit pixels on the respective upper and lower sides of the portion surrounded by the dotted line 101 in FIG. 12 have the configuration in which two unit pixels share a SEL and an AMP, as in the portion surrounded by the dotted line 101. In other words, unit pixels are laid out by using the portion surrounded by the dotted line 101 as a repetition unit.

Figure 13:
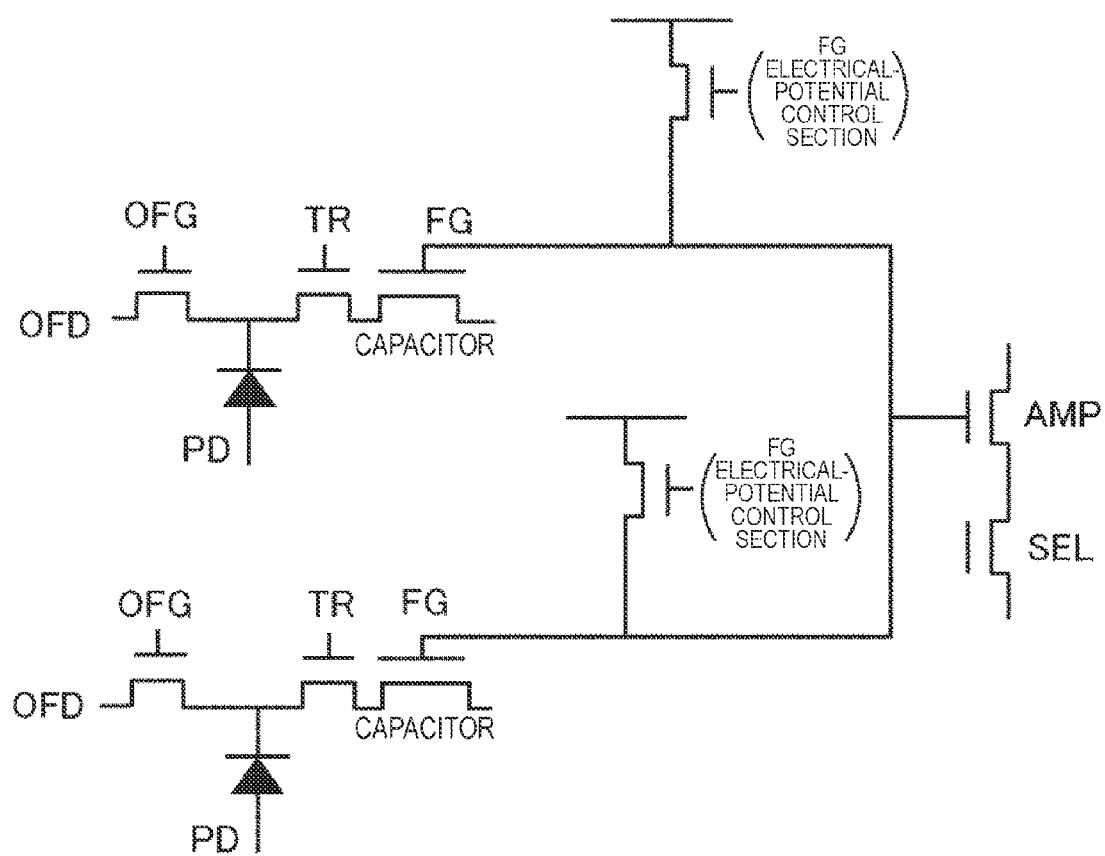
FIG. 13 is a circuit diagram showing an example of an equivalent circuit in a portion surrounded by a dotted line in FIG. 12.

FIG. 13 is a circuit diagram showing an example of an equivalent circuit in the portion surrounded by the dotted line 101 in FIG. 12. As shown in FIG. 13, the FGs on the respective upper and lower sides of FIG. 13 are connected to the one AMP.

In this way, a pixel array of a CMOS image sensor can also employ the pixel sharing configuration by using the unit pixels to which the present technology is applied.

Note that application of the present technology is not limited to the application to the solid-state image sensor such as the CMOS image sensor. That is, the present technology is applicable to a general electronic device using a solid-state image sensor for an image capturing section (a photoelectric conversion section), the general electronic device including an imaging apparatus such as a digital still camera or a video camera, a mobile terminal device having an image capturing function, a copier using a solid-state image sensor for an image reading section, and the like. The solid-state image sensor may be formed as one chip, may be formed in such a manner that a plurality of chips are stacked or arranged adjacent to each other, or may be formed as a module having an image capturing function in which an image capturing section and either a signal processing section or an optical system are packaged together.

Figure 14:
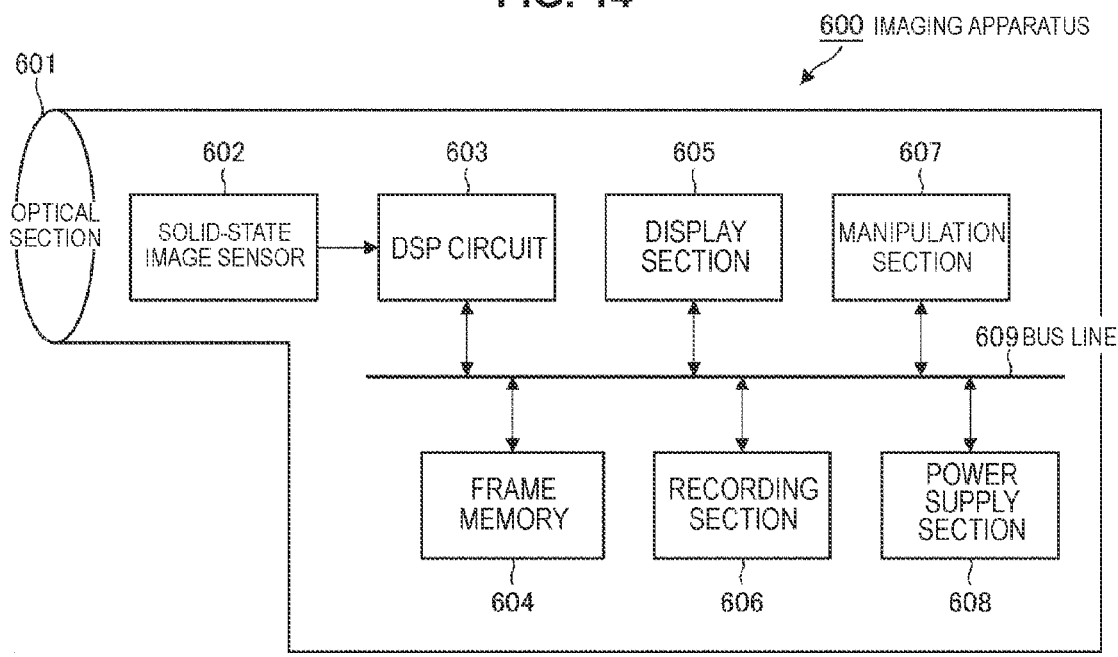
FIG. 14 is a block diagram of a configuration example of an imaging apparatus serving as an electronic device to which the present technology is applied.

FIG. 14 is a block diagram of a configuration example of an imaging apparatus serving as an electronic device to which the present technology is applied.

An imaging apparatus 600 in FIG. 14 includes: an optical section 601 formed by a lens group or the like; a solid-state image sensor (an image-capturing device) 602 employing the aforementioned configuration using two pixels; and a DSP circuit 603 which is a camera signal processing circuit. The imaging apparatus 600 also includes a frame memory 604, a display section 605, a recording section 606, a manipulation section 607, and a power supply section 608. The DSP circuit 603, the frame memory 604, the display section 605, the recording section 606, the manipulation section 607, and the power supply section 608 are connected to each other via a bus line 609.

The optical section 601 takes in incident light (image light) from a subject to form an image on an imaging surface of the solid-state image sensor 602. The solid-state image sensor 602 converts a light amount of incident light into an electrical signal on a pixel basis and outputs the electrical signal, the incident light being used for forming the image on the imaging surface by the optical section 601. It is possible to use, as the solid-state image sensor 602, a solid-state image sensor such as the CMOS image sensor including the plurality of unit pixels 10 according to the aforementioned embodiment which are arranged on the CMOS image sensor, that is, a solid-state image sensor which makes it possible to capture an image without distortion by using global exposure.

The display section 605 includes a panel display device such as a liquid crystal panel or an organic EL (Electro Luminescence) panel, and displays a moving image or a still image captured by the solid-state image sensor 602. The recording section 606 records the moving image or the still image captured by the solid-state image sensor 602 in a recording medium such as a video tape or a DVD (Digital Versatile Disk).

The manipulation section 607 issues manipulation instructions for various functions of the imaging apparatus 600 in accordance with user's manipulation. The power supply section 608 appropriately supplies the DSP circuit 603, the frame memory 604, the display section 605, the recording section 606, and the manipulation section 607 with power to cause these sections to operate.

As described above, the use of the CMOS image sensor according to the aforementioned embodiment as the solid-state image sensor 602 makes it possible to enhance the sensitivity of the image sensor employing the global shutter and to appropriately reduce noise. Accordingly, it is possible to achieve high quality of a captured image in the imaging apparatus 600 such as a video camera, a digital still camera, or further a camera module for a mobile device such as a mobile phone.

In addition, the aforementioned embodiment has been described by taking as an example the case where the present technology is applied to the CMOS image sensor including the unit pixels arranged in a matrix form, the unit pixels each sensing, as a physical quantity, a signal charge corresponding to a light amount of visible light. The application of the present technology, however, is not limited to the application to the CMOS image sensor. The present technology is applicable to a general column-system solid-state image sensor including a column processing section arranged for each pixel column in a pixel array section.

The application of the present technology is not limited to the application to the solid-state image sensor which captures an image by sensing distribution of incident light amounts of visible light. The present technology is also applicable to: a solid-state image sensor which captures an image based on distribution of incidence amounts of infrared rays, X-rays, particles or the like; and a general solid-state image sensor in a broad sense (a physical-quantity distribution sensing device) such as a fingerprint detection sensor which captures an image by sensing distribution of other physical quantities such as pressures or electrostatic capacitances.

Note that a series of processing steps described above in the specification may of course be processed in chronological order in accordance with the stated order, but may not necessarily be processed in the chronological order, and may be processed individually or in a parallel manner.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) A solid-state image sensor including:
a plurality of unit pixels arranged thereon, the plurality of unit pixels each including
a light receiving section which stores a charge generated by photoelectric conversion,
a signal storage section which is connected to the light receiving section and has a structure of a MOS capacitor, and
a signal output section to which a gate electrode of the MOS capacitor is connected.

(2) The solid-state image sensor according to (1),
wherein the signal output section includes a transistor and outputs, to a vertical signal line of a pixel array in which the plurality of unit pixels arranged, a signal based on a change in a potential of the gate electrode occurring in accordance with a charge stored in the signal storage section.

(3) The solid-state image sensor according to (2),
wherein the light receiving section and the signal storage section are connected via a transfer transistor, and
wherein the charge stored in the light receiving section is transferred via the transfer transistor, and thereafter, the charge stored in the signal storage section is depleted.

(4) The solid-state image sensor according to (3),
wherein the charge stored in the signal storage section is depleted by discharging the charge stored in the signal storage section via the light receiving section with a potential of the transfer transistor high and a potential of the gate electrode of the MOS capacitor low.

(5) The solid-state image sensor according to (3), further including:
a depletion transistor connected to the gate electrode of the MOS capacitor,
wherein the charge stored in the signal storage section is depleted by discharging the charge stored in the signal storage section with a potential of the depletion transistor high and the potential of the gate electrode of the MOS capacitor low.

(6) The solid-state image sensor according to (3),
wherein in a case of performing CDS processing of detecting a difference between a signal component and a reset component of a signal output from each of the plurality of unit pixels, the charge stored in the signal storage section is depleted after an end of a D-phase sampling period and before a start of a P-phase sampling period in the CDS processing.

(7) The solid-state image sensor according to (6), further including:
a potential control section which applies a negative bias to the gate electrode of the MOS capacitor.

(8) The solid-state image sensor according to (7),
wherein the potential control section applies the negative bias to the gate electrode of the MOS capacitor after an end of the P-phase sampling period.

(9) The solid-state image sensor according to (3),
wherein an electronic shutter operation of discharging the charge stored in the light receiving section is concurrently performed in each of the plurality of unit pixels,
wherein the charge stored in the light receiving section is transferred to the signal storage section in response to an identical exposure time period in each of the plurality of unit pixels, and
wherein the charge stored in the signal storage section is held in a period until a reading time which varies depending on an arrangement position of each of the plurality of unit pixels in the pixel array.

(10) The solid-state image sensor according to (3),
wherein the MOS capacitor is provided as a buried-channel MOS, a potential is set low on a surface of a channel, and a region having a deep potential is formed away from the surface to store a signal charge.

(11) The solid-state image sensor according to (3),
wherein the MOS capacitor includes a junction FET.

(12) An electronic device including:
a solid-state image sensor having a plurality of unit pixels arranged thereon, the plurality of unit pixels each including
a light receiving section which stores a charge generated by photoelectric conversion,
a signal storage section which is connected to the light receiving section and has a structure of a MOS capacitor, and
a signal output section to which a gate electrode of the MOS capacitor is connected.

The present disclosure contains subject matter related to that disclosed in Japanese Priority Patent Application JP 2012-096180 filed in the Japan Patent Office on Apr. 20, 2012, the entire content of which is hereby incorporated by reference.

What is claimed is:

1. An imaging device comprising:
a photoelectric conversion element configured to generate a charge;
an over flow transistor coupled to the photoelectric conversion element, the over flow transistor is configured to discharge a charge from the photoelectric conversion element;
a transfer transistor coupled to the photoelectric conversion element, the transfer transistor is configured to transfer a charge from the photoelectric conversion element;
a single MOS capacitor with a floating gate electrode, the single MOS capacitor is configured to hold a charge from the transfer transistor;
a control transistor coupled to the gate electrode of the single MOS capacitor;
an amplifier transistor coupled to the gate electrode of the single MOS capacitor; and
a select transistor coupled to the amplifier transistor,
wherein the over flow transistor, the photoelectric conversion element, and the single MOS capacitor are disposed in a Nth row, and the select transistor, the amplifier transistor and the control transistor are disposed in a (N+1)th row.

2. The imaging device according to claim 1, wherein a signal based on a change in a potential of the floating gate electrode is output to a vertical signal line of a pixel array in which the photoelectric conversion element is arranged.

3. The imaging device according to claim 1, wherein the charge stored in the photoelectric conversion element is transferred via the transfer transistor.

4. The imaging device according to claim 1, wherein the charge stored in the single MOS capacitor is depleted by discharging the stored charge with a potential of the transfer transistor high and a potential of the floating gate electrode of the single MOS capacitor low.

5. The imaging device according to claim 1, further comprising a depletion transistor connected to the floating gate electrode of the single MOS capacitor, wherein the depletion transistor is configured to deplete the single MOS capacitor.

6. The imaging device according to claim 1, further comprising circuitry configured for performing correlated double sampling (CDS), wherein the CDS processing is performed to detect a difference between a signal component and a reset component of a charge output from the photoelectric conversion element.

7. The imaging device according to claim 1, comprising a plurality of photoelectric conversion elements in a pixel array, wherein an electronic shutter operation of concurrently discharging the charges stored in the plurality of photoelectric conversion elements is performed, wherein the charges stored in the plurality of photoelectric conversion elements are transferred in response to an identical exposure time period.

8. The imaging device according to claim 1, wherein the single MOS capacitor is a buried-channel MOS capacitor, a potential is set low on a surface of a channel, and a region having a deep potential well is formed away from the surface to store a signal charge.

9. The imaging device according to claim 1, wherein the single MOS capacitor includes a junction FET.

10. An electronic device comprising an imaging device having a plurality of unit pixels each including:
a photoelectric conversion element configured to generate a charge,
an over flow transistor coupled to the photoelectric conversion element, the over flow transistor is configured to discharge a charge from the photoelectric conversion element;
a transfer transistor coupled to the photoelectric conversion element, the transfer transistor is configured to transfer a charge from the photoelectric conversion element;
a single MOS capacitor with a floating gate electrode, the single MOS capacitor is configured to hold a charge from the transfer transistor;
a control transistor coupled to the gate electrode of the single MOS capacitor;
an amplifier transistor coupled to the gate electrode of the single MOS capacitor; and
a select transistor coupled to the amplifier transistor,
wherein the over flow transistor, the photoelectric conversion element, and the single MOS capacitor are disposed in a Nth row, and the select transistor, the amplifier transistor and the control transistor are disposed in a (N+1)th row.

11. The electronic device of claim 10, wherein a signal based on a change in a potential of the floating gate electrode is output to a vertical signal line of a pixel array in which the photoelectric conversion element is arranged.

12. The electronic device of claim 10, wherein the charge stored in the photoelectric conversion element is transferred via the transfer transistor.

13. The electronic device of claim 10, wherein the charge stored in the single MOS capacitor is depleted by discharging the stored charge with a potential of the transfer transistor high and a potential of the floating gate electrode of the single MOS capacitor low.

14. The electronic device of claim 10, further comprising a depletion transistor connected to the floating gate electrode of the single MOS capacitor, wherein the depletion transistor is configured to deplete the single MOS capacitor.

15. The electronic device of claim 10, further comprising circuitry configured for performing correlated double sampling (CDS), wherein the CDS processing is performed to detect a difference between a signal component and a reset component of a charge output from the photoelectric conversion element.

16. The electronic device of claim 10, wherein:

the solid-state sensor comprises a plurality of photoelectric conversion elements in a pixel array;

an electronic shutter operation of concurrently discharging the charges stored in the plurality of photoelectric conversion elements is performed;

the charges stored in the photoelectric conversion elements are transferred in response to an identical exposure time period.

17. The electronic device of claim 10, wherein the single MOS capacitor is a buried-channel MOS capacitor, a potential is set low on a surface of a channel, and a region having a deep potential well is formed away from the surface to store a signal charge.

18. The electronic device of claim 10, wherein the single MOS capacitor includes a junction FET.

19. The imaging device according to claim 1, wherein the photoelectric conversion element is disposed between the over flow transistor and the single MOS capacitor.

20. The imaging device according to claim 1, wherein the amplifier transistor is disposed between the select transistor and the control transistor.

21. The imaging device according to claim 1, wherein a charge stored in the photoelectric conversion element is discharged from a drain terminal of the over flow transistor.

22. The imaging device according to claim 1, wherein a charge stored in the photoelectric conversion element is discharged from a gate terminal of the over flow transistor.

* * * * *